United States Patent
Chou et al.

[11] Patent Number: 5,933,748
[45] Date of Patent: *Aug. 3, 1999

[54] SHALLOW TRENCH ISOLATION PROCESS

[75] Inventors: George Chou; Coming Chen, both of Hsinchu, Taiwan

[73] Assignee: United Microelectronics Corp., Taiwan

[21] Appl. No.: 08/775,805

[22] Filed: Dec. 31, 1996

Related U.S. Application Data

[XX .
[60] Provisional application No. 60/010,427, Jan. 22, 1996, and provisional application No. 60/019,696, Jun. 10, 1996.

[51] Int. Cl.$^6$ .................................................. H01L 21/76
[52] U.S. Cl. ........................... 438/431; 438/437; 438/692
[58] Field of Search ...................................... 438/431, 437, 438/FOR 227, 702, 692, 693, FOR 111, 959; 148/DIG. 85, DIG. 86, DIG. 50

[56] References Cited

U.S. PATENT DOCUMENTS

| | | |
|---|---|---|
| 4,471,525 | 9/1984 | Sasaki . |
| 4,493,740 | 1/1985 | Komeda . |
| 4,666,556 | 5/1987 | Fulton et al. . |
| 5,294,562 | 3/1994 | Lur et al. . |
| 5,496,765 | 3/1996 | Schwalke . |
| 5,521,422 | 5/1996 | Mandelman et al. . |
| 5,786,263 | 7/1998 | Perera . |

OTHER PUBLICATIONS

Fuse, G., et al, "A Practical Trench Isolation Technology with a Novel Planarization Process", Semiconductor Research Center, Mitsubishi, 732 IEDM 1987, pp. 732–735, 1987.

Wolf, S., "Silicon Processing for the VLSI Era: vol. 2, Process Integration", Lattice Press, pp. 47–48, 1990.

Wolf, S., "Silicon Processing for the VLSI Era: vol. 3, The Submicron Mosfet". Lattice Press, pp. 371–373, 1995.

*Primary Examiner*—George Fourson
*Attorney, Agent, or Firm*—Rabin & Champagne P.C.

[57] ABSTRACT

A shallow trench isolation process provides a high quality oxide on the substrate adjacent the trench and on the upper part of the trench. This process avoids the formation of poor quality oxide on the substrate adjacent the upper edge of the trench that is believed to cause MOS transistors to exhibit the undesirable subthreshold current flow known as the "kink" effect. A pad oxide layer is grown on the surface of a silicon substrate and then a layer of silicon nitride is formed on the surface of the pad oxide. A photoresist mask is formed over the silicon nitride and the silicon nitride and pad oxide are etched, and then the substrate is etched to form a trench. The photoresist mask is removed, a layer of polysilicon is deposited over the silicon nitride layer and within the trench and the polysilicon layer is oxidized. CVD oxide is deposited to overfill the trench and then the excess CVD oxide and polysilicon oxide is removed by CMP, using the silicon nitride layer as an polish stop. The silicon nitride is stripped and the trench oxide is etched using an HF dip to provide a substantially planar surface. A layer of polysilicon is deposited on the device and doping, patterning and etching are used to define wiring lines and gate electrodes from the polysilicon. The polysilicon oxide lining the trench is more durable than the CVD oxide that fills the rest of the trench, and so better protects the substrate near the trench during subsequent etching and polishing steps.

11 Claims, 7 Drawing Sheets

SHALLOW TRENCH ISOLATION PROCESS

This application claims priority from provisional application Ser. No. 60/010,427, filed Jan. 22, 1996, and provisional application Ser. No. 60/019,696, filed Jun. 10, 1996.

BACKGROUND OF THE INVENTION

1. Field of the Invention

The present invention relates to the provision of device isolation regions between devices of an integrated circuit formed in and on a semiconductor substrate.

2. Description of the Related Art

A variety of integrated circuits incorporate device isolation regions formed between adjacent semiconductor devices to prevent carriers from traveling through the substrate between the adjacent devices. For example, device isolation regions are conventionally formed between adjacent field effect transistors (FETs) in dense semiconductor circuits such as dynamic random access memories (DRAMs) to reduce charge leakage to and from the FETs. Often, device isolation regions take the form of thick field oxide regions extending below the surface of the semiconductor substrate. The most common early technique for forming a field oxide region is the local oxidation of silicon ("LOCOS") technique, the results of which are schematically illustrated in FIG. 1. Referring to FIG. 1, a silicon substrate 10 has a field oxidation region 12 separating two FETs 14 and 16. Each of the FETs has a source, drain, channel, and a gate over the channel region. The illustrated devices might be part of a memory circuit, and there would conventionally be additional circuitry included for this portion of the circuit including, for example, charge storage capacitors, wiring lines formed on the field oxide region 12 and over other regions, and a variety of other wiring lines, contacts and circuits.

LOCOS field oxidation regions are formed by first depositing a layer of silicon nitride on the substrate surface and then selectively etching a portion of the silicon nitride layer to form a mask exposing the substrate where the field oxidation will be formed. The masked substrate is placed in an oxidation environment and a thick silicon oxide layer is grown at the regions exposed by the mask, forming an oxide layer extending above and below the surface of the substrate. The silicon nitride mask is almost unaffected by the oxidation environment and the mask limits lateral oxidation, so that the lateral extent of the field oxidation region is largely determined by the mask. Oxide growth undercuts the silicon nitride mask at its edge, however, extending laterally into and somewhat above the substrate along the edge of the nitride mask. Consequently, the field oxide region 12 includes what are known as "bird's beak" regions 18 along its edges. As illustrated in FIG. 1, the bird's beak regions 18 are thinner oxide regions extending away from the main portion of the field oxidation region along the surface of the substrate.

The bird's beak regions formed in the LOCOS growth of field oxide region 12 are undesirable, particularly as further attempts are made to reduce the size and spacing of memory cells. Because the bird's beak regions are thin, they provide little in terms of device isolation. The bird's beak regions nevertheless consume substrate surface area, limiting the extent to which the field oxide region can be shrunk while still providing desirable levels of device isolation. To provide higher device densities, it is therefore desirable to utilize a different device isolation structure.

An alternative to LOCOS field oxidation is the use of shallow trench isolation ("STI"). In STI, a sharply defined trench is formed in the semiconductor substrate by, for example, anisotropic etching. The trench is filled with oxide back to the surface of the substrate to provide a device isolation region. Trench isolation regions formed by STI have the advantages of providing device isolation across their entire lateral extent and of providing a more planar structure. Aspects of the manufacture of conventional trench isolation regions, however, may reduce the reliability of structures and devices formed immediately adjacent to the trench isolation region.

It is accordingly an object of the present invention to provide a trench isolation region that provides desirable levels of reliability in the structures and devices formed adjacent to the trench isolation region as well as in the level of isolation provided by the trench isolation.

SUMMARY OF THE PREFERRED EMBODIMENTS

An aspect of the present invention provides a method of making a semiconductor device comprising the steps of providing a semiconductor substrate having a surface, forming a mask over a trench region and etching through the surface of the semiconductor substrate to form a trench having walls within the semiconductor substrate. A layer of protective material is formed over the walls of the trench and then the layer of protective material is covered with an insulating material, thereby filling the trench.

Another aspect of the present invention is a method of making a semiconductor device on a semiconductor substrate having a surface where a mask is formed over a trench region and then the surface of the semiconductor substrate is etched to form a trench within the semiconductor substrate. A layer of polysilicon is deposited over the substrate and within the trench and the layer of polysilicon is oxidized within the trench to form a layer of oxidized polysilicon at least adjacent to the surface of the substrate. The trench is then filled with an insulating material.

Still another aspect of the present invention provides a method of making a semiconductor device comprising the steps of providing a semiconductor substrate having a surface, forming a silicon nitride layer over the surface of the semiconductor substrate, etching the silicon nitride layer to expose the surface of the semiconductor substrate and etching through the surface of the semiconductor substrate to form a trench within the semiconductor substrate. The method continues by depositing a layer of polysilicon over the silicon nitride layer and within the trench so that the layer of polysilicon is in contact with the semiconductor substrate within the trench near the surface of the substrate. The layer of polysilicon is oxidized within the trench to form a layer of polysilicon oxide at least adjacent to the surface of the substrate. An insulating plug is formed within the trench having an upper surface. A wiring line is formed extending over a portion of the surface of the semiconductor substrate and extending onto or above the upper surface of the insulating plug.

DESCRIPTION OF THE PREFERRED EMBODIMENTS

Figure 1:
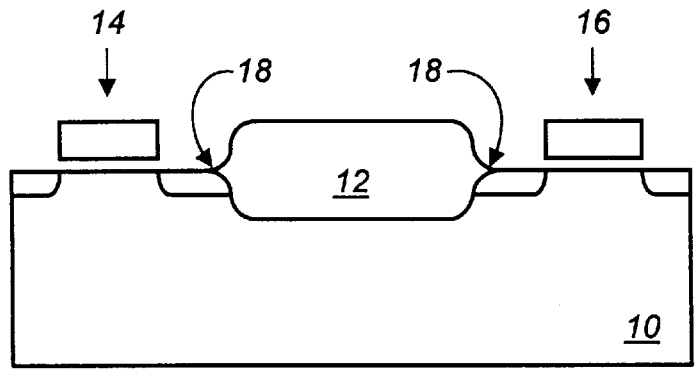
FIG. 1 illustrates a field oxidation region formed using the LOCOS technique, including the bird's beak regions formed on the periphery of the LOCOS field oxidation region.

Trench isolation regions may be formed in the substrate of integrated circuits to isolate adjacent MOS devices within the integrated circuits. Often, the gate electrodes of such MOS devices extend as wiring lines over the surface of the integrated circuit substrate and over adjacent trench isolation regions. The wiring lines are often separated from the substrate at the edge of the adjacent trench by a single thin oxide layer, typically the same oxide layer that forms the gate oxide of the adjacent MOS device. Sometimes, wiring lines are formed that electrically couple to the semiconductor substrate or, in some cases, it is even possible for the wiring lines to be directly shorted to the substrate. The present inventors have observed that this electrical coupling likely occurs through an oxide layer that has relatively poor insulating properties near the edge of the trench so that the wiring line is coupled to the substrate through the oxide layer between the wiring line and the substrate at the edge of the trench. Electrically coupling a wiring line to the substrate at the edge of a trench isolation region can, for example, generate parasitic MOSFETs between the wiring line and the edge of the trench. The formation of parasitic MOSFETs can alter the performance of MOS devices formed adjacent to the trench. For example, an unreliable oxide layer may provide sufficient coupling between a wiring line and the substrate to reduce the threshold voltage of an adjacent MOSFET or to cause an abnormal subthreshold signal to flow in the MOSFET (the so-called "kink" effect).

The electrical coupling of wiring lines to the substrate relates to the formation of unreliable gate oxide layers under the wiring line near the edge of the trench region. The present inventors have observed that the formation of unreliable gate oxide layers is associated with the methods used to form the trench isolation region. For example, overetching of the oxide plug typically used to fill the isolation trench can expose the substrate at the wall of the trench. Subsequent oxidation of the substrate appears to form an oxide layer having relatively poor insulating properties at the edge of the trench. The present inventors believe that the formation of poor insulating layers near shallow trench isolation structures is an important mechanism limiting the performance of integrated circuit devices which incorporate MOS devices separated by trench isolation regions. By providing a high quality oxide layer adjacent to the trench isolation region, for example, it may be possible to improve the performance and reliability of such integrated circuit devices. Consequently, preferred embodiments of the present invention form a shallow trench isolation region in a manner that provides more reliable oxide layers over the substrate, especially over regions of the substrate immediately adjacent the shallow trench isolation region.

Particularly preferred embodiments of the present invention provide a shallow trench isolation region having an protective layer formed on the walls of the trench in a manner that prevents undesirable etching of the trench walls or the adjacent substrate during formation of the shallow trench isolation region. Most preferably, the protective layer is an insulator formed on the walls of the trench and in particular, the protective layer is a polysilicon oxide formed immediately after the trench etch is performed. A polysilicon oxide, or another protective material having similar durability, formed on the trench walls after the trench etch protects the walls of the trench and the substrate adjacent to the trench during subsequent etches. The present inventors believe that forming this protective layer prevents the undesirable loss of oxide from the substrate near the edge of the trench, preventing the formation of certain types of parasitic MOSFETs and reducing the likelihood of abnormal subthreshold current flowing in the completed device.

FIGS. 2–12 illustrate a sequence of process steps in the formation of a conventional shallow trench isolation region used to isolate transistors in a memory circuit. More particularly, FIGS. 2–12 illustrate the present inventors' observations as to a failure mechanism which appears associated with the conventional formation of shallow trench isolation regions because it results in the formation of unreliable gate oxide layers. After the specification discusses the formation of unreliable gate oxide layers associated with undesirable transistor performance, embodiments of the present invention that form trench isolation regions in a manner that facilitates production of reliable gate oxides are described with reference to FIGS. 13–22. In these and other figures, like reference numerals are used to identify the same or similar structures to aid in the understanding of the discussion.

Figure 2:
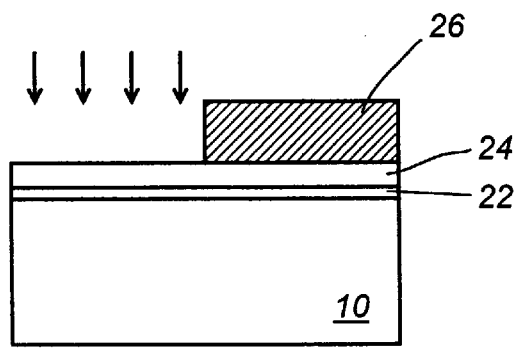
FIGS. 2–12, schematically illustrate processing steps in the formation of a trench isolation and illustrate certain problems which arise in the formation of such structures.
Figure 3:
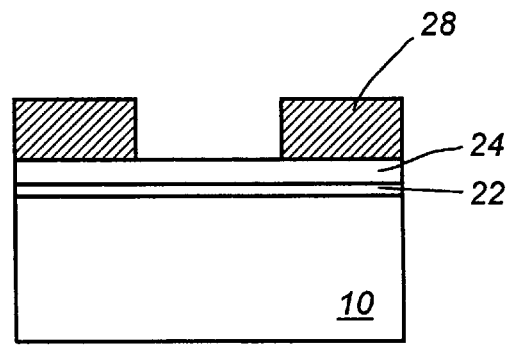
Figure 4:
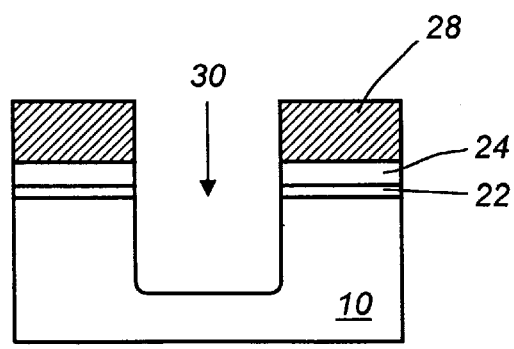

FIG. 2 illustrates an early stage in the processing of an exemplary memory circuit in which an unreliable technique is used to form a shallow trench isolation region. Silicon substrate 10 is coated with a thermal oxide layer 22 that acts as a pad oxide layer during processing. The pad oxide layer protects the surface of the substrate during processing and is preferably removed before the final gate oxide layer is formed. A layer of silicon nitride 24 is formed by chemical vapor deposition on the pad oxide layer 22 and then a layer of photoresist is deposited, exposed and etched to form an implantation mask 26 on the surface of the silicon nitride layer 24. Ions are typically implanted into the substrate at this stage of the processing to form an electrical isolation device such as an isolation well having a p/n junction along its boundaries. This implantation might alternatively be performed later in the processing, after the planarization of the trench isolation regions shown between FIGS. 6 and 9. The implantation mask 26 is then removed. Next, a trench definition mask 28 as illustrated in FIG. 3 is formed by depositing a layer of photoresist onto silicon nitride layer 24 and then exposing and etching the photoresist layer to form the mask 28. A trench is formed in the substrate by consecutively etching the silicon nitride layer 24, the pad oxide layer 22, and then etching a trench 30 into the silicon substrate 10 (FIG. 4). The trench etching mask 28 is then removed.

Figure 5:
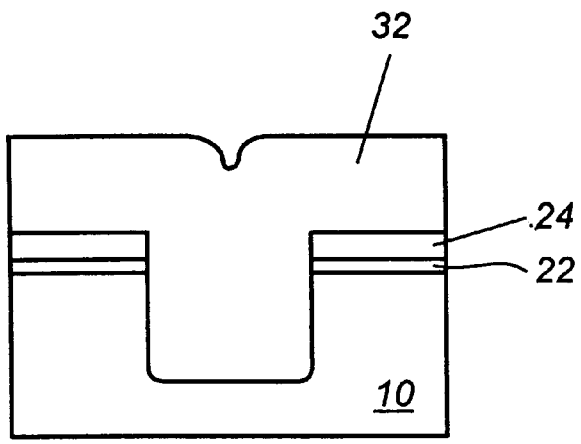
Figure 6:
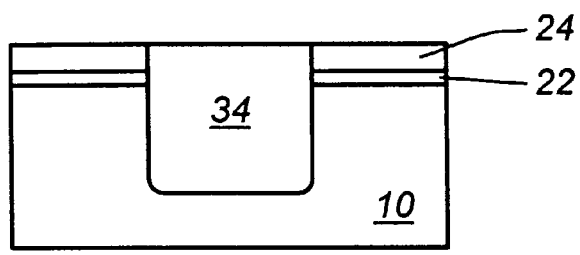
Figure 7:
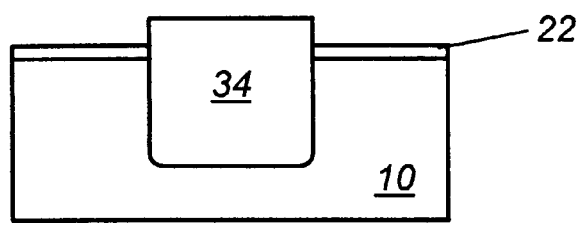
Figure 8:
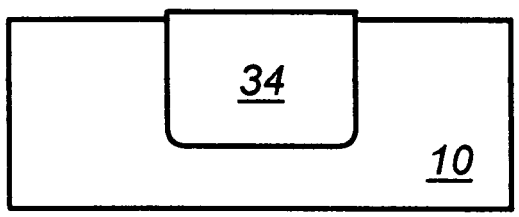

Next, the trench 30 is filled with a layer of silicon oxide 32, for example, by atmospheric pressure chemical vapor deposition (APCVD) using tetraethylorthosiloxane (TEOS) as a source gas. The trench is conventionally overfilled during deposition, as shown in FIG. 5, because TEOS oxide typically requires a densification process and the TEOS oxide layer shrinks during densification. Densification of the TEOS oxide is accomplished at a temperature of approximately 1000° C. for a time period of between 10–30 minutes. After densification, the portion of the TEOS oxide layer extending above the silicon nitride layer 24 is removed by chemical mechanical polishing using the silicon nitride layer 24 as a stop for the polishing process, leaving an oxide plug 34 in the trench region (FIG. 6). Although not shown in FIG. 6, the surface of the oxide plug 34 is typically recessed slightly below the surface of the silicon nitride layer 24 during chemical mechanical polishing because the oxide plug is softer than the silicon nitride layer. The silicon nitride layer 24 is next removed to expose the pad oxide layer 22, typically leaving a portion of the oxide plug 34 extending above the surface of the pad oxide layer 22 (FIG. 7). A hydrofluoric acid dip is used to remove the pad oxide (FIG. 8). A thickness of the oxide plug 34 greater than the thickness of the pad oxide layer 22 is removed during this etching process because the TEOS oxide plug 34 is etched more rapidly than the thermal oxide of the pad oxide layer 22.

Figure 9:
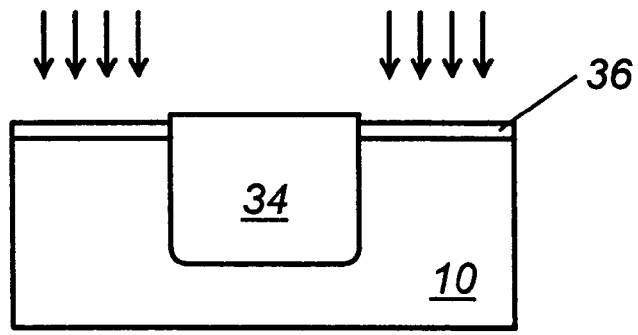
Figure 10:
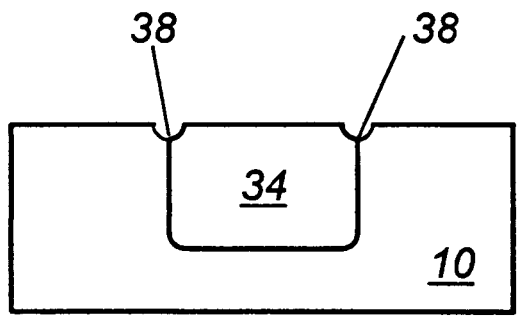

A sacrificial oxide layer 36 is grown on the surface of the substrate 10 to protect the substrate surface from damage. One or more implantations, such as one or more channel threshold adjust implantations, are performed as required by the device being formed (FIG. 9). The sacrificial oxide layer 36 is then removed, once again using a hydrofluoric acid dip, resulting in the structure schematically illustrated in FIG. 10. Often, the combined actions of the oxide etching steps illustrated in FIGS. 8 and 10 cause a sufficient amount of the plug oxide 34 to be etched so that the surface of the plug oxide is recessed below the surface of the substrate 10. The overetching condition may be most pronounced at the edges of the oxide plug 34 immediately adjacent the surface of the substrate 10, or the entire surface of the oxide plug may be recessed substantially uniformly below the surface of the substrate. In either case, overetching may cause a "shoulder" portion of the substrate 38 to be exposed and partially etched at the side wall of the trench, or only a thin layer of TEOS oxide may cover the substrate adjacent the side wall of the trench.

Figure 11:
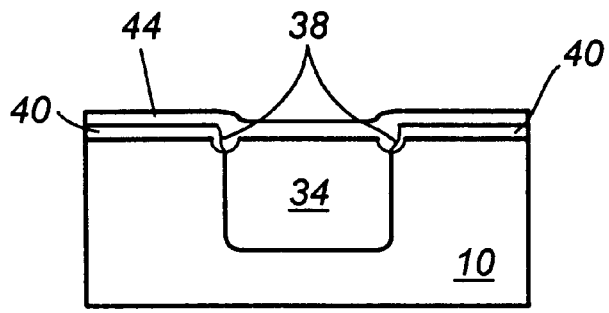
Figure 12:
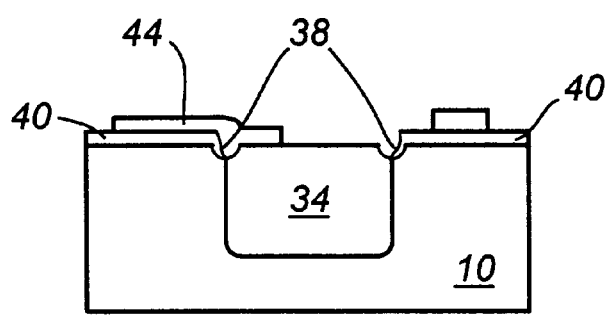

Referring now to FIG. 11, a gate oxide layer 40 is next grown thermally over the exposed surface of the substrate 10. As a practical matter, the gate oxide layer 40 is of poor quality with a convex profile at the "shoulder" region 38 of the substrate near the trench isolation region. A polysilicon layer 42 is then deposited over the surface of the substrate by chemical vapor deposition. Polysilicon layer 42 is typically doped by ion implantation and annealing, and then patterned to form a wiring line 44 such as that shown in FIG. 12. Because the wiring line 44 extends over both the gate oxide layer 40 and the surface of the oxide plug 34, the wiring line also extends over the shoulder region 38 near the sidewall of the trench. Thus, the poor quality gate oxide sometimes formed over shoulder regions 38 is sufficiently thin and poor as to allow for parasitic MOSFET action at the shoulder region. The formation of parasitic MOSFETs or other forms of electrical coupling between the wiring line and the substrate can reduce the turn-on threshold voltage of the transistor channel and can produce the abnormal subthreshold current associated with the "kink" effect. Because either a reduction in the transistor threshold voltage or an abnormal subthreshold current is undesirable, the present inventors propose the following process for forming a shallow trench isolation region, as described below with reference to FIGS. 13–22.

To avoid forming poor quality and unreliable gate oxide layers over substrate shoulder regions or adjacent shallow trench isolation regions, preferred embodiments of the present invention preferably form a layer of protective material over the walls of the trench soon after the formation of the trench. By forming an appropriate protective layer on the walls of the trench, to subsequent etching steps will not expose the walls of the trench so that etching of the trench walls should not occur. Thus, aspects of the present invention prevent the formation of an undesirable shoulder region adjacent the trench isolation region where a poor quality oxide layer could be formed. Particularly preferred embodiments of the present invention form a protective layer soon after the trench etch is performed. An appropriate protective layer may be polysilicon oxide formed by depositing a thin layer of polysilicon over the walls and floor of the trench, followed by an oxidation of the polysilicon to form a thin and conformal polysilicon oxide ("polyoxide") layer covering the inner surface of the trench. Aspects of preferred embodiments of the present invention and of methods for forming integrated circuits in accordance with the present invention are now described with reference to FIGS. 13–22.

Figure 13:
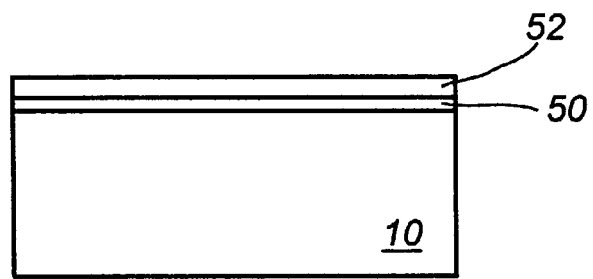
FIGS. 13–22 schematically illustrate processing steps in the formation of a trench isolation structure in accordance with preferred embodiments of the present invention.
Figure 14:
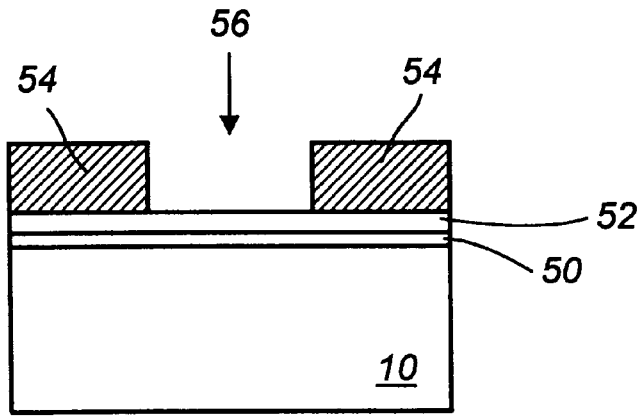

As illustrated in FIG. 13, a thermal oxide layer 50 is grown over the surface of the substrate 10. Alternatively, the oxide could be deposited by chemical vapor deposition (CVD). Layer 50 is typically a pad oxide layer for protecting the surface of the substrate from damage in subsequent processing steps, but might also be a gate oxide layer when steps are taken to preserve a high quality oxide layer. The thickness of the thermal oxide layer 50 grown is whatever is necessary to protect the substrate. Next, a layer of masking material 52 is deposited over the layer of pad oxide 50. The layer of masking material 52 either has a trench mask formed on its surface or it may itself be patterned to serve as a mask for the trench etch. Layer 52 preferably also acts as a stop for the chemical mechanical polishing (CMP) step that may be used to remove the TEOS oxide typically used as an insulator plug to fill the trench. As such, silicon nitride is a particularly preferred masking material because of its durability and suitability as a stop for CMP. Layer 52 may thus be silicon nitride deposited by CVD to a thickness of 1000–3000 Å. A layer of photoresist is then formed over the layer of masking material 52 and the photoresist layer 54 is shaped using a trench etching mask in the usual manner so that the surface of masking material 52 is exposed at a region 56 where the trench will be formed by etching, as illustrated in FIG. 14. The photoresist layer may itself be used as the mask for etching layers 52 and 50 as well as the substrate 10 in forming the trench region, or the photoresist mask 54 may be used to define a mask in layer 52 which can then be used for the subsequent etching steps. Most often, a photoresist mask is used to define the lateral extent of all of the etching steps used in the formation of the trench in the substrate, because fewer processing steps are involved.

Figure 15:
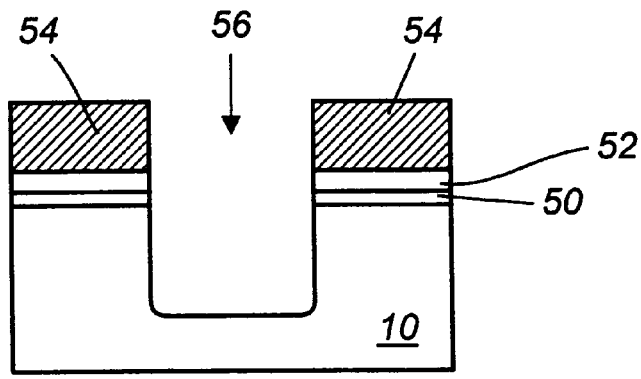

The trench is formed by consecutively etching layers 52 and 50 from the surface of the substrate where exposed by the mask 54 and then etching the substrate. The etch processes used are preferably highly anisotropic and may, for example, be performed by reactive ion etching (RIE). If silicon nitride is used for layer 52, then a suitable etchant gas mixture may include a mixture of $SF_6$, He and $O_2$. Oxide layer 50 is etched using, for example, a gas mixture consisting of $CHF_3$, $O_2$ and Ar. The trench is etched into the silicon substrate using RIE and a mixture of gases including $Cl_2$, He, HBr and $O_2$, with the lowest portion of the trench being etched using $SF_6$ so that the trench has rounded edges at its bottom. An appropriate trench for forming a shallow trench isolation is illustrated in FIG. 15 and may be approximately 4000 Å deep. If desired, a thin thermal oxide layer may be grown on the sidewalls and bottom of the trench to remove defects created by the etching process. If such a thin oxide layer is formed, the layer can either be left in place, becoming part of the trench plug, or the thin oxide layer may be removed.

Figure 16:
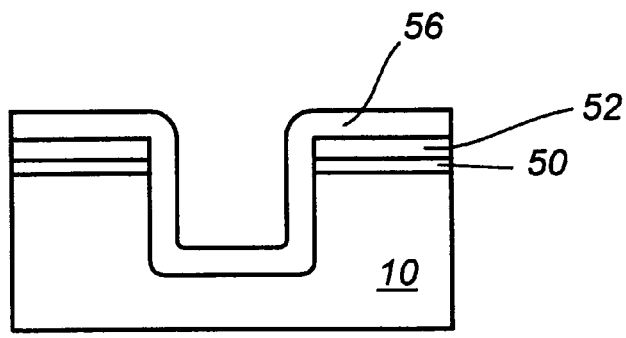

Next, as shown in FIG. 16, a thin layer of polysilicon 56 is deposited over the surface of the device, for example, by low pressure chemical vapor deposition (LPCVD) at a temperature of approximately 620° C. This layer of polysilicon will preferably be completely oxidized to form a layer of polysilicon oxide (polyoxide) to protect the sidewalls of the trench during subsequent processing steps. Polysilicon oxide is a preferred protective layer for the trench sidewalls because polyoxide is readily compatible with other processing steps and the shallow trench isolation region being formed. Insulating protective layers such as polyoxide are particularly preferred when the trench isolation is formed between adjacent MOS transistors or other devices which have highly doped device regions adjacent to opposite sides of the trench. Of the various insulators that might be used, polyoxide is particularly appropriate for use within trench isolation regions because it provides an oxide of silicon which is generally similar to the materials conventionally used to fill trenches, because polyoxide etches more slowly than the CVD oxides typically used to fill the trench and because polyoxide is harder than CVD oxides. As such, the etching and polishing steps typically used to planarize the CVD oxide plug with the surface of the substrate (shown in FIGS. 6–10) should not completely remove the polyoxide from the walls of the trench adjacent to the surface of the trench. In addition. the layer of polysilicon used to form the polyoxide can be deposited in a highly conformal manner and with excellent coverage, so that the resultant polyoxide will cover the walls of the trench conformally.

The polysilicon layer 56 preferably is deposited to a sufficient thickness that, when the polysilicon layer is converted to polyoxide, the polyoxide layer is substantially free from pinholes and is sufficiently thick to prevent subsequent etching steps from etching through the polyoxide. The upper thickness of the polysilicon layer 56 is primarily limited by throughput considerations and by the desirability of converting the entire polysilicon layer to polyoxide. Accordingly, it is preferred that the polysilicon layer 56 be deposited to a thickness of at least approximately 100 Å, and more preferably within the range of between about 150–300 Å. Polysilicon layer 56 is typically not doped. The polysilicon layer 56 is then converted to oxide by placing the device in a oxidizing environment at an appropriate temperature. For example, the polysilicon layer may be oxidized in $O_2$ at a temperature of approximately 850–1050° C. for about 30 minutes. The duration of the oxidation step should be sufficient to convert most or all of the polysilicon layer to polyoxide (58, shown in FIG. 17) and will depend on the thickness of the polysilicon layer formed. Generally, the polysilicon layer 56 expands when oxidized, so that a 150 Å polysilicon layer will form an approximately 300 Å thick polyoxide layer and 300 Å thick polysilicon layer will form an approximately 500 Å thick polyoxide layer.

Figure 17:
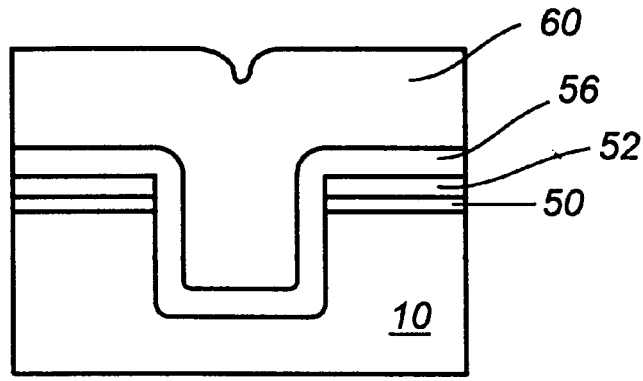

A thick layer of insulation material 60 is then deposited, as shown in FIG. 17, preferably to fill the trench region and to provide a surface on which other material can be deposited. Most often, a thick oxide layer is deposited using the ozone TEOS or CVD TEOS processes. Conventional CVD techniques including atmospheric pressure CVD (APCVD), LPCVD and plasma enhanced CVD (PECVD) can be successfully used for forming the type of conformal oxide layer often preferred as the plug material within the trench. When a TEOS oxide is used as the layer 60, it is preferred that the TEOS layer be deposited to a thickness of approximately 6000 Å. Overfilling the trench region with a TEOS oxide layer is preferred because the TEOS layer shrinks by approximately 6% during densification. The TEOS oxide layer is then densified at a temperature of approximately 1000° C. for a period of between 10 to 30 minutes.

For the preferred embodiments in which layer 60 is a TEOS oxide layer or another type of insulator for which the trench is overfilled, the process continues by etching to remove the excess portion of the layer 60 which extends over the surface of the substrate 10. Most preferably this is accomplished by chemical mechanical polishing (CMP) down to the surface of the layer 52. When CMP is used, it is particularly preferred that layer 52 comprise silicon nitride or a similar hard material that performs well as a CMP stop. As a consequence of removing the excess portion of layer 60, an insulating plug 62 (FIG. 18) is formed in the trench so that the surface of the plug 62 is approximately at the surface of the masking layer 52. The surface of the plug preferably extends above the surface of the substrate 10. Masking layer 52 is then removed. When silicon nitride is used for the layer 52, the silicon nitride layer can be removed by dipping the device into a solution of $H_3PO_4$ held at a temperature of between 150–180° C. Typically, the pad oxide layer 50 is stripped in a dilute HF solution, which removes a portion of the insulating plug 62, as well. Because the polyoxide portion 58 of the insulating plug etches in dilute HF more slowly than does TEOS oxide, the edges of the polyoxide portion will typically not be etched to the same extent as the central portion of the insulating plug (not shown in FIG. 19).

Figure 18:
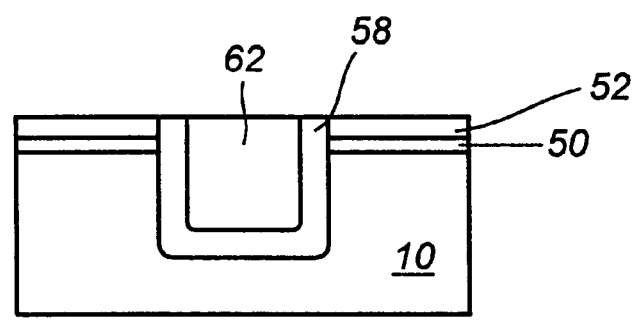
Figure 19:
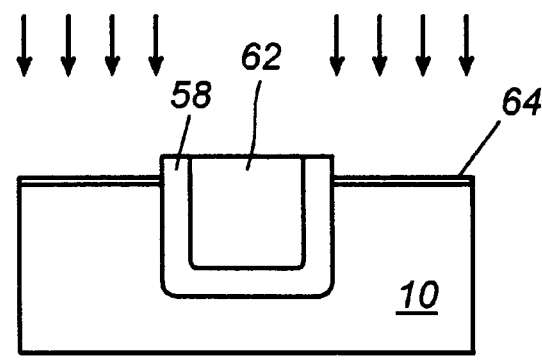
Figure 20:
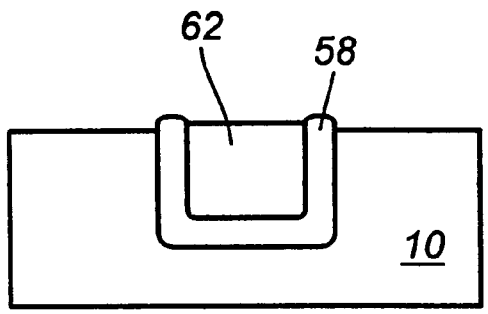

After layers 52 and 50 are stripped, it is conventional to grow a new protective oxide layer 64 (FIG. 19) to a thickness of 200–300 Å for protecting the surface of the substrate and for limiting the channeling of ions implanted in a subsequent ion implantation step. At this time, well implantations and channel implantations can be made through the protective oxide layer 64. Preferably, these implantations are activated using rapid thermal anneals (e.g., by heating the device to 1000° C. for a few to tens of seconds) performed at the same time that the subsequent source and drain implantations are activated. The protective oxide layer 64 is then stripped in dilute HF, which removes a further portion of the insulating plug 62 and a lesser amount of the polyoxide 58, producing the structure illustrated in FIG. 20. Because the walls of the trench are covered by the polyoxide layer 58, etches that are sufficient to remove the two sacrificial oxide layers 50 and 64 are not generally insufficient to remove the height by which the polyoxide layer extends above the surface of the substrate 10. As illustrated in FIG. 18, the height by which the polyoxide portion of insulating plug 58 extends above the surface of the substrate is approximately equal to the thickness of the masking layer 52 after completion of the CMP process. If this height is approximately 1000 Å, then the height of the polyoxide portion 58 should be sufficient to survive the stripping of a 300 Å pad oxide layer 50 and the stripping of a 300 Å protective oxide layer 64. In this way, as illustrated in FIG. 20, the trench walls remain covered and protected throughout the processing.

Figure 21:
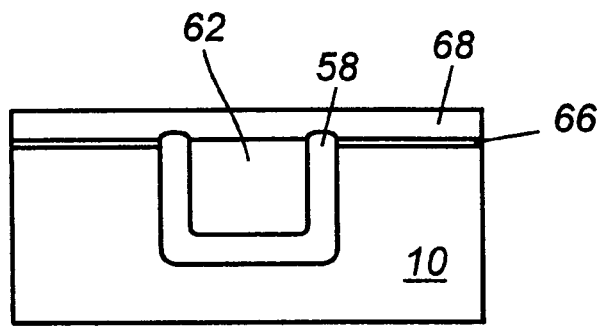
Figure 22:
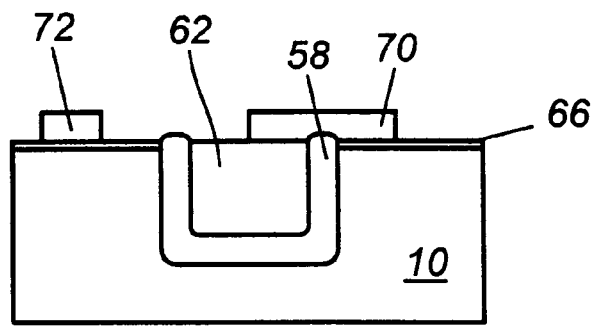

Referring now to FIG. 21, the desired integrated circuit devices are formed on the substrate 10, such as MOS transistors. To form a MOS transistor, a gate oxide layer 66 may be grown in a oxygen environment at a temperature of 900–1000° C. to a thickness appropriate to the particular MOS transistor being formed, for example, between about 50–200 Å. The lowest level wiring layer is next formed by depositing a layer of wiring material 68 on the device. For example, a layer of polysilicon may be deposited by low pressure chemical vapor deposition (LPCVD) at a substrate temperature of approximately 620° C. to a thickness of between about 2000–3000 Å, as appropriate to the particular device. When the wiring layer comprises polysilicon, the layer is preferably doped by implanting an impurity such as boron or phosphorus that is activated by a later rapid thermal anneal. It may also be desirable to deposit a layer of a refractory metal or refractory metal silicide such as tungsten silicide on the layer of polysilicon. Alternatively, a self-aligned suicide ("salicide" ) process may be performed subsequent to the patterning of the layer 68. The wiring structure thus formed has a polycide structure and the total thickness of the wiring line is between about 2000–3000 Å. When the layer(s) of wiring material 68 are also used to form the gates of transistors such as FETs, the requirements of such gate electrodes are preferably taken into account in choosing the particular configuration of the wiring layers. Processing of the semiconductor circuit continues by patterning and etching the wiring layers to form wiring lines such as wiring line 70 and a gate electrode 72, as shown in FIG. 22.

Further conventional processing is performed to provide source and drain regions on either side of the gate electrode 72, typically by providing a light implantation dose, forming oxide spacers on either side of the gate electrode 72, covering the MOS transistors with insulating material, providing the other devices which constitute the desired integrated circuit and forming the contacts and interconnects necessary to complete the semiconductor circuit. For example, if the partial circuit illustrated in FIG. 22 is formed into a DRAM memory cell, additional structures including a charge storage capacitor and bit lines are provided. In such a DRAM memory cell, the wiring line 70 might be connected to the gate electrode of another MOS transistor not illustrated in FIG. 22. Because of the methods used in forming the trench isolation region, there is a reduced likelihood that a unreliable oxide layer will exist where the wiring line 70 passes over the edge of the substrate adjacent the trench. Thus, the performance of the MOS transistor connected to wiring line 70 will be less likely to be impaired by the action of a parasitic MOS transistor or other form of undesired electrical coupling between the wiring line 70 and the substrate adjacent the trench.

By forming a shallow trench isolation in accordance with the present invention as described above, there is a much lower chance that an etching operation will reduce the level of the insulating plug below the surface of the substrate. Accordingly, a gate oxide layer formed adjacent the trench will be of higher quality than might otherwise occur.

While the present invention has been described with particular emphasis on certain preferred embodiments of the present invention, the present invention is not limited to the particular embodiments described herein. Rather, the scope of the present invention is to be determined by the following claims.

What is claimed is:

1. A method of making a semiconductor device comprising the steps of:

providing a semiconductor substrate having a surface;

forming a mask over a trench region and etching through the surface of the semiconductor substrate to form a trench within the semiconductor substrate;

depositing a layer of polysilicon over the substrate and within the trench;

oxidizing the layer of polysilicon within the trench to form a layer of oxidized polysilicon that extends above the surface of the substrate adjacent to the trench;

filling the trench with an insulating material; and forming a gate oxide layer over the surface of the substrate subsequent to the step of filling the trench with the insulating material, wherein the layer of oxidized polysilicon extends above the surface of the substrate adjacent to the trench subsequent to the step of forming a gate oxide layer.

2. The method of claim 1, wherein the insulating material is a TEOS oxide having an upper surface at or near the surface of the semiconductor substrate.

3. The method claim 2, wherein the entire layer of polysilicon is oxidized so that the layer of polysilicon oxide covers the surface of the device and the trench, the method further comprising the steps of:

removing a portion of the insulating material, leaving at least some of the insulating material within the trench; and removing a portion of the layer of polysilicon oxide, while leaving at least some of the layer of polysilicon oxide within the trench.

4. The method of claim 3, further comprising the step of forming a layer of silicon nitride over the substrate prior to depositing the layer of polysilicon, wherein the steps of removing a portion of the insulating material and of removing a portion of the layer of polysilicon oxide are performed by a planarizing chemical mechanical polishing process using the layer of silicon nitride as a stop for the polishing process.

5. A method of making a semiconductor device comprising the steps of:

providing a semiconductor substrate having a surface;

forming a silicon nitride layer over the surface of the semiconductor substrate;

etching the silicon nitride layer to expose the surface of the semiconductor substrate and etching through the surface of the semiconductor substrate to form a trench within the semiconductor substrate;

depositing a layer of polysilicon over the silicon nitride layer and within the trench so that the layer of polysilicon is in contact with the semiconductor substrate within the trench near the surface of the substrate;

oxidizing the layer of polysilicon within the trench to form a layer of polysilicon oxide at least adjacent to the surface of the substrate;

forming an insulating plug within the trench and having a upper surface;

stripping the silicon nitride layer from a surface of a thermal oxide layer covering the surface of the substrate;

subsequently forming a layer of gate oxide over the surface of the substrate, a surface of the layer of gate oxide adjacent to the trench being lower than an upper edge of the layer of polysilicon oxide; and forming a wiring line extending over a portion of the surface of the semiconductor substrate and extending onto or above the upper surface of the insulating plug.

6. The method of claim 5, wherein the wiring line is in contact with a gate oxide formed over the surface of the semiconductor substrate, with the layer of polysilicon oxide, and with the insulating plug.

7. The method of claim 5, wherein the insulating plug is formed by depositing a layer of oxide over the surface of the substrate and within the trench.

8. The method of claim 7, wherein the layer of oxide is deposited to overfill the trench and wherein an excess portion of the layer of oxide is removed using chemical mechanical polishing.

9. The method of claim 7, wherein the layer of silicon nitride functions as a stop for a chemical mechanical polishing process used to remove a portion of the insulating plug.

10. The method of claim 5, comprising the further step of depositing a layer of polysilicon on the gate oxide layer, on exposed edges of the layer of polysilicon oxide, and on the upper surface of the insulating plug.

11. A method of making a semiconductor device comprising the steps of:

providing a semiconductor substrate having a surface;

forming a mask over a trench region and etching through the surface of the semiconductor substrate to form a trench within the semiconductor substrate;

depositing a layer of polysilicon over the substrate and within the trench;

oxidizing the layer of polysilicon within the trench to form a layer of oxidized polysilicon that extends above the surface of the substrate adjacent to the trench;

filling the trench with an insulating material; and forming a gate oxide layer over the surface of the substrate so as to abut a portion of the layer of oxidized polysilicon above the surface of the substrate adjacent to the trench, subsequent to the step of filling the trench with the insulating material.

\* \* \* \* \*